(12) United States Patent
Voldman

(10) Patent No.: US 8,962,480 B2
(45) Date of Patent: Feb. 24, 2015

(54) ESD NETWORK CIRCUIT WITH A THROUGH WAFER VIA STRUCTURE AND A METHOD OF MANUFACTURE

(75) Inventor: Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/487,904

(22) Filed: Jun. 4, 2012

(65) Prior Publication Data

US 2012/0238069 A1 Sep. 20, 2012

Related U.S. Application Data

(63) Continuation of application No. 12/411,612, filed on Mar. 26, 2009, now Pat. No. 8,232,625.

(51) Int. Cl.
| | |
|---|---|
| *H01L 21/44* | (2006.01) |
| *H01L 27/02* | (2006.01) |
| *H01L 23/48* | (2006.01) |
| *H01L 23/522* | (2006.01) |
| *H01L 23/58* | (2006.01) |
| *H01L 23/60* | (2006.01) |
| *H01L 25/065* | (2006.01) |

(52) U.S. Cl.
CPC .......... *H01L 27/0248* (2013.01); *H01L 23/481* (2013.01); *H01L 23/5225* (2013.01); *H01L 23/5227* (2013.01); *H01L 23/585* (2013.01); *H01L 23/60* (2013.01); *H01L 25/0657* (2013.01); *H01L 2225/06541* (2013.01); *H01L 2924/3011* (2013.01); *H01L 2924/0002* (2013.01)
USPC .................................. 438/667; 257/E21.597

(58) Field of Classification Search
None
See application file for complete search history.

(56) References Cited

U.S. PATENT DOCUMENTS

| | | | |
|---|---|---|---|
| 5,567,968 A | 10/1996 | Tsuruta et al. | |
| 5,703,747 A | 12/1997 | Voldman et al. | |
| 5,901,022 A | 5/1999 | Ker | |
| 5,973,396 A | 10/1999 | Farnworth | |
| 6,313,512 B1 | 11/2001 | Schmitz et al. | |
| 6,608,363 B1 | 8/2003 | Fazelpour | |
| 6,732,428 B1 * | 5/2004 | Kwong ........................ | 29/832 |

(Continued)

FOREIGN PATENT DOCUMENTS

| | | |
|---|---|---|
| JP | 2004006691 | 1/2004 |
| JP | 2008124205 | 5/2008 |
| WO | 2008121619 | 9/2008 |

OTHER PUBLICATIONS

Voldman, S. et al., "Guard Rings: Theory, Experimental Quantification and Design", IBM Microelectronics, Electrical Overstress/Electrostatic Discharge Symposium 2005, Sep. 16, 2005, 10 pages.

(Continued)

*Primary Examiner* — Michael Lebentritt
*Assistant Examiner* — Kevin Quinto
(74) *Attorney, Agent, or Firm* — Anthony Canale; Roberts Mlotkowski Safran & Cole, P.C.

(57) ABSTRACT

A method includes forming an ESD active device on a substrate, forming a ground plane on a backside of the substrate and forming at least one through wafer via electrically connected to a negative power supply of the ESD active device and the ground plane to provide a low series resistance path to the substrate.

4 Claims, 12 Drawing Sheets

(56) References Cited

U.S. PATENT DOCUMENTS

| | | |
|---|---|---|
| 6,975,032 B2 | 12/2005 | Chen et al. |
| 7,265,433 B2 | 9/2007 | Pillai et al. |
| 7,335,972 B2 | 2/2008 | Chanchani |
| 7,355,273 B2 | 4/2008 | Jackson et al. |
| 2001/0010964 A1 | 8/2001 | Geissler et al. |
| 2002/0113267 A1 | 8/2002 | Brown et al. |
| 2003/0197243 A1* | 10/2003 | Beng et al. ............... 257/531 |
| 2004/0195651 A1 | 10/2004 | Zhang et al. |
| 2004/0238894 A1 | 12/2004 | Furuta |
| 2005/0247999 A1* | 11/2005 | Nishikawa et al. ........ 257/531 |
| 2005/0266673 A1 | 12/2005 | Hu et al. |
| 2005/0282381 A1 | 12/2005 | Cohen et al. |
| 2007/0029646 A1* | 2/2007 | Voldman ................... 257/662 |
| 2007/0296055 A1 | 12/2007 | Yen et al. |
| 2008/0073747 A1* | 3/2008 | Chao et al. ............... 257/520 |
| 2008/0237789 A1 | 10/2008 | He et al. |
| 2008/0254572 A1 | 10/2008 | Leedy |
| 2009/0283898 A1 | 11/2009 | Janzen et al. |
| 2010/0059869 A1 | 3/2010 | Kaskoun et al. |
| 2010/0244187 A1 | 9/2010 | Voldman |

OTHER PUBLICATIONS

Voldman, S. et al., "Latchup and the Domino Effect", IBM Microelectronics, Reliability Physics Symposium Proceedings 43rd Annual 2005 IEEE International, Apr. 17, 2005, 12 pages.

Hsiao, Y. et al., "Ultra Low-Capacitance Bond Pad for RF Applications in CMOS Technology", 2007 IEEE Radio Frequency Integrated Circuits Symposium, pp. 303-306.

Hsiao, Y. et al., "Bond Pad Design with Low Capacitance in CMOS Technology for RF Applications", IEEE Electron Device Letters, vol. 28, No. 1, Jan. 2007, pp. 68-70.

International Search Report and Written Opinion for corresponding International Application No. PCT/EP2010/053307.

* cited by examiner

ESD NETWORK CIRCUIT WITH A THROUGH WAFER VIA STRUCTURE AND A METHOD OF MANUFACTURE

CROSS REFERENCE TO RELATED APPLICATION

This application is a continuation application of copending U.S. patent application Ser. No. 12/411,612 filed on Mar. 26, 2009, the contents of which are incorporated herein by reference in their entirety.

FIELD OF THE INVENTION

The present invention generally relates to a circuit structure and a method of manufacturing a circuit, and more specifically to an electrostatic discharge (ESD) circuit with a through wafer via structure and a method of manufacture.

BACKGROUND OF THE INVENTION

An ESD event refers to a phenomenon of electrical discharge of a current (positive or negative) for a short duration during which a large amount of current is provided to an integrated circuit (IC). The large current may be built-up from a variety of sources, such as the human body. An ESD event commonly results from the discharge of a high voltage potential (typically, several kilovolts) and leads to pulses of high current (several amperes) of a short duration (typically, 100 nanoseconds). An ESD event is generated within an IC, illustratively, by human contact with the leads of the IC or by electrically charged machinery being discharged in other leads of an IC. During installation of integrated circuits into products, these electrostatic discharges may destroy the IC and thus require expensive repairs on the products, which could have been avoided by providing a mechanism for dissipation of the electrostatic discharge to which the IC may have been subjected.

Manufacturers and users of ICs must take precautions to avoid ESD. For example, ESD prevention can be part of the device itself and may include special design techniques for device input and output pins. Additionally, external protection components can also be used with the circuit layout. For example, to protect ICs from an ESD event, many schemes have been implemented for ESD structures, including, for example, the use of a silicon controlled rectifier (SCR). An SCR can sustain high currents, hold the voltage across the SCR at a low level and may be implemented to bypass high current discharges associated with an ESD event.

ESD devices may also be used to prevent latchup and provide noise isolation. More specifically, noise isolation and the elimination of complementary metal-oxide semiconductor (CMOS) latchup are significant issues in advanced CMOS technology, radio frequency (RF) CMOS, and bipolar CMOS (BiCMOS) Silicon Germanium (SiGe) technology. Latchup conditions typically occur within peripheral circuits or internal circuits, within one circuit (intra-circuit), or between multiple circuits (inter-circuit). In one such example, latchup occurs when a PNPN structure transitions from a low-current/high-voltage state to a high-current/low-voltage state through a negative resistance region (i.e., forming an S-Type I-V (current/voltage) characteristic).

Latchup can occur as a result of the interaction of an electrostatic discharge (ESD) device, the input/output (I/O) off-chip driver and adjacent circuitry initiated in the substrate from the overshoot and undershoot phenomena. These factors can be generated by CMOS off-chip driver (OCD) circuitry, receiver networks, and ESD devices. In CMOS I/O circuitry, undershoot and overshoot can lead to injection in the substrate, and simultaneous switching of circuitry where overshoot or undershoot injection occurs may lead to both noise injection and latchup conditions. Also, supporting elements in these circuits, such as pass transistors, resistor elements, test functions, over voltage dielectric limiting circuitry, bleed resistors, keeper networks and other elements can be present, contributing to noise injection into the substrate and latchup.

Latchup also can occur from voltage or current pulses that occur on the power supply lines. For example, transient pulses on power rails (e.g., substrate or wells) can trigger latchup processes. Latchup can also occur from a stimulus to the well or substrate external to the region of a thyristor structure from minority carriers.

Additionally, latchup can be initiated from internal or external stimulus, and is known to occur from single event upsets (SEU), which can include terrestrial emissions from nuclear processes, and cosmic ray events, as well as events in space environments. Cosmic ray particles can include proton, neutron, and gamma events, as well as a number of particles that enter the earth atmosphere. Terrestrial emissions from radioactive events, such as alpha particles, and other radioactive decay emissions can also lead to latchup in semiconductors.

In operation, ESD structures (or networks) require low resistance current paths to discharge high currents to the VDD (positive) power supply and the VSS (negative) power supply. That is, ESD networks need a low resistance shunt to the substrate. Additionally, ESD circuits are needed that contain both active elements and passive elements. Furthermore, ESD elements use guard rings to isolate minority carrier injection to adjacent structures.

An aim of ESD circuits is to provide a low resistance path to a substrate. Conventionally, standard metal levels are used to provide this low resistance path. However, as the metal levels are getting thinner due to scaling, the wiring levels provide greater capacitance between the different physical levels.

Accordingly, there exists a need in the art to overcome the deficiencies and limitations described hereinabove.

BRIEF SUMMARY

In a first aspect of the invention, an electrostatic discharge (ESD) structure, comprises an ESD active device and at least one through wafer via structure providing a low series resistance path for the ESD active device to a substrate.

In an additional aspect of the invention, an apparatus, comprises an input, at least one power rail and an ESD circuit electrically connected between the input and the at least one power rail. The ESD circuit comprises at least one through wafer via structure providing a low series resistance path to a substrate.

In a further aspect of the invention, a method comprises forming an ESD active device on a substrate and forming a ground plane on a backside of the substrate. Additionally, the method comprises forming at least one through wafer via electrically connected to a negative power supply of the ESD active device and the ground plane to provide a low series resistance path to the substrate.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF THE INVENTION

The present invention generally relates to a circuit structure and a method of manufacturing a circuit, and more specifically to an electrostatic discharge (ESD) circuit with a through wafer via structure and a method of manufacture. As discussed above, ESD circuits require low resistance shunt structures, which can, for example, dump current, power and/or heat. Additionally, as discussed above, ESD circuits utilize guard rings to isolate minority carrier injection to adjacent structures.

In accordance with aspects of the invention, a through wafer via may be used in an ESD structure to provide a low resistance path to the substrate for the ESD circuit. Additionally, the through wafer via can act as "guard ring" for the ESD circuit to prevent lateral minority carrier injection to adjacent structures and/or from injection sources, e.g., observed in NMOS, PMOS or CMOS semiconductor chips. By implementing the present invention, a through wafer via may be utilized to perform the dual roles of a low resistance shunt to ground and a portion of a guard ring structure to prevent negative carrier injection. Moreover, by utilizing a single element to perform these dual roles, manufacturing and design costs may be reduced.

In embodiments, the guard ring or structure (hereinafter generally referred to as "guard ring") of the present invention serves the purpose of providing electrical and spatial isolation between, for example, adjacent circuit elements preventing interaction between devices and circuits that may undergo latchup. This is achieved by the prevention of minority carriers from migrating within a given circuit (intra-circuit), or the prevention of minority carriers from entering a sensitive circuit (inter-circuit). In the first case, the guard ring prevents the minority carriers from leaving a region of the ESD circuit and entering another region of the ESD circuit. In the second case, when injection is internal, the guard ring prevents the minority carriers from leaving the region of the ESD circuit and influencing the surrounding circuitry. Moreover, when the injection is external to the ESD circuit, the guard ring prevents the minority carriers from influencing the ESD circuit.

ESD Structure

Figure 1:
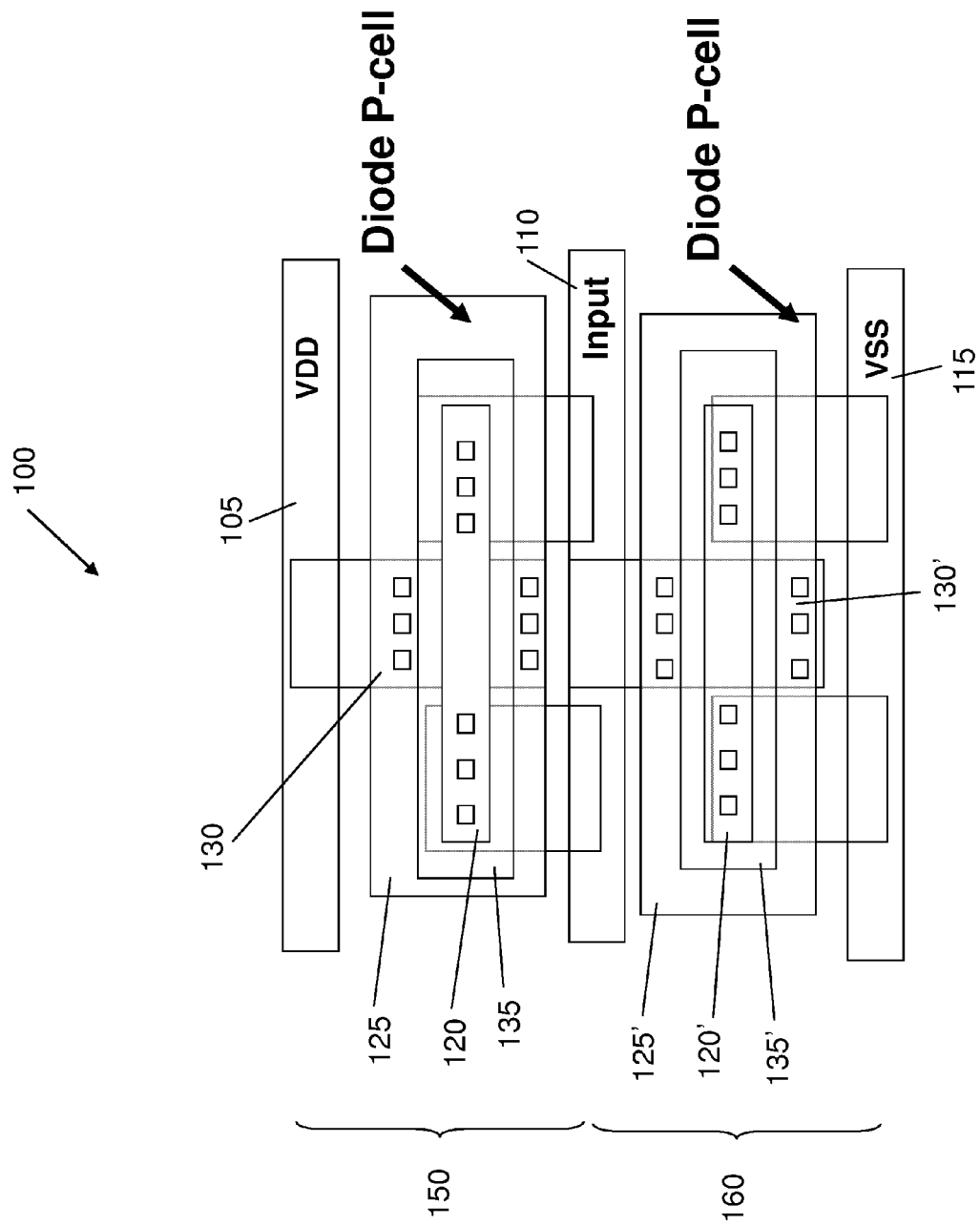
FIG. 1 shows an exemplary top view of an ESD circuit.

FIG. 1 shows a top view of an exemplary ESD circuit 100. More specifically, FIG. 1 shows an exemplary double diode or dual diode ESD circuit 100 comprising diodes 150 and 160.

As shown in FIG. 1, the ESD circuit 100 includes a VDD positive power supply 105, an input 110 and a VSS negative power supply 115. Additionally, the ESD circuit 100 includes two P+anodes 120 and 120' in respective N-wells 125 and 125' and their respective cathodes 130 and 130'. As should be understood by those of ordinary skill in the art, the N-wells 125 and 125' are formed in a P-type substrate (not shown in FIG. 1). Shallow trench isolations (STIs) 135 and 135' are respectively located in N-wells 125 and 125' to electrically isolate the P+anodes 120 and 120'.

As shown in FIG. 1, the P+anode 120 is electrically connected with the input 110, and the cathode 130 is electrically connected with the VDD positive power supply 105. Moreover, the P+anode 120' is electrically connected with the VSS negative power supply 115, and the cathode 130' is electrically connected with the input 110. The operation of the exemplary ESD circuit 100 would be readily understood by those of ordinary skill in the art, such that further description of the ESD circuit is not necessary for an understanding of the present invention.

Figure 2:
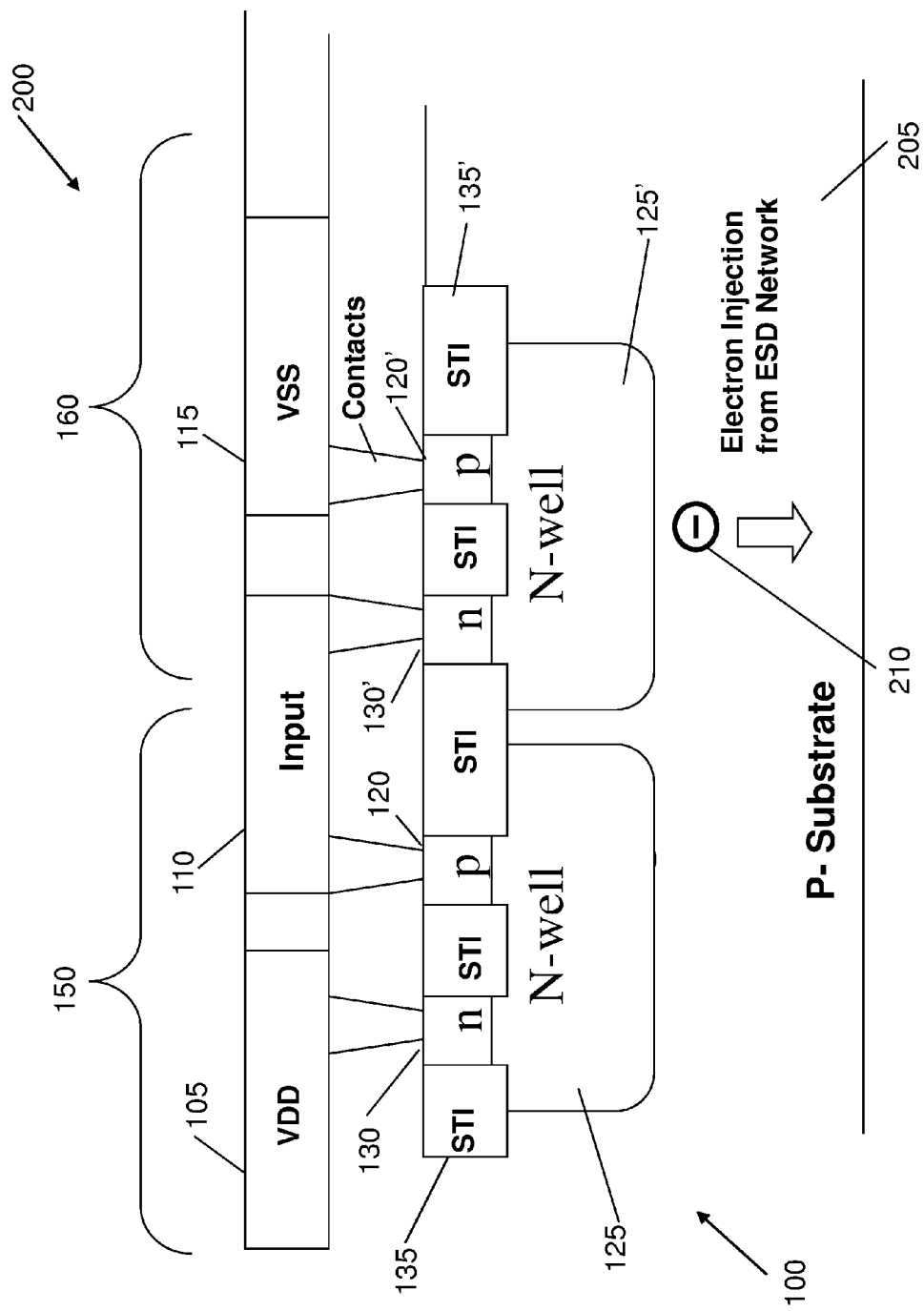
FIG. 2 shows an exemplary side view of an ESD circuit.

FIG. 2 shows a side view 200 of the exemplary double diode or dual diode ESD circuit 100 shown in FIG. 1. As shown in FIG. 2, the ESD circuit 100 includes a VDD positive power supply 105, an input 110 and a VSS negative power supply 115. Additionally, the ESD circuit 100 includes two P+anodes 120 and 120' in respective N-wells 125 and 125' and their respective cathodes 130 and 130'. The N-wells 125 and 125' are formed in a P-type substrate 205. Shallow trench isolations (STIs) 135 and 135' are respectively located in N-wells 125 and 125' to isolate the P+ anodes 120 and 120'.

As shown in FIG. 2, the ESD circuit 100 in operation may inject electrons 210, i.e., minority carrier injection, into the P-substrate 205. For example, if the input 110 to the right-hand diode 160 goes negative, the right hand diode injects electrons 210 into the substrate 205, as the cathode 130' of the right-hand diode 160 is electrically connected to the substrate 205. Moreover, the injection of the diode 160 to any surrounding circuitry can be in different directions (e.g., north, south, east and/or west).

As should be understood by those of ordinary skill in the art, this minority carrier injection of electrons 210 may detrimentally affect adjacent structures. For example, an ESD circuit may inject electrons into the substrate, which can lead to latch up into surrounding circuitry or otherwise influence surrounding circuits.

ESD Structure with Through Wafer Vias

Figure 3:
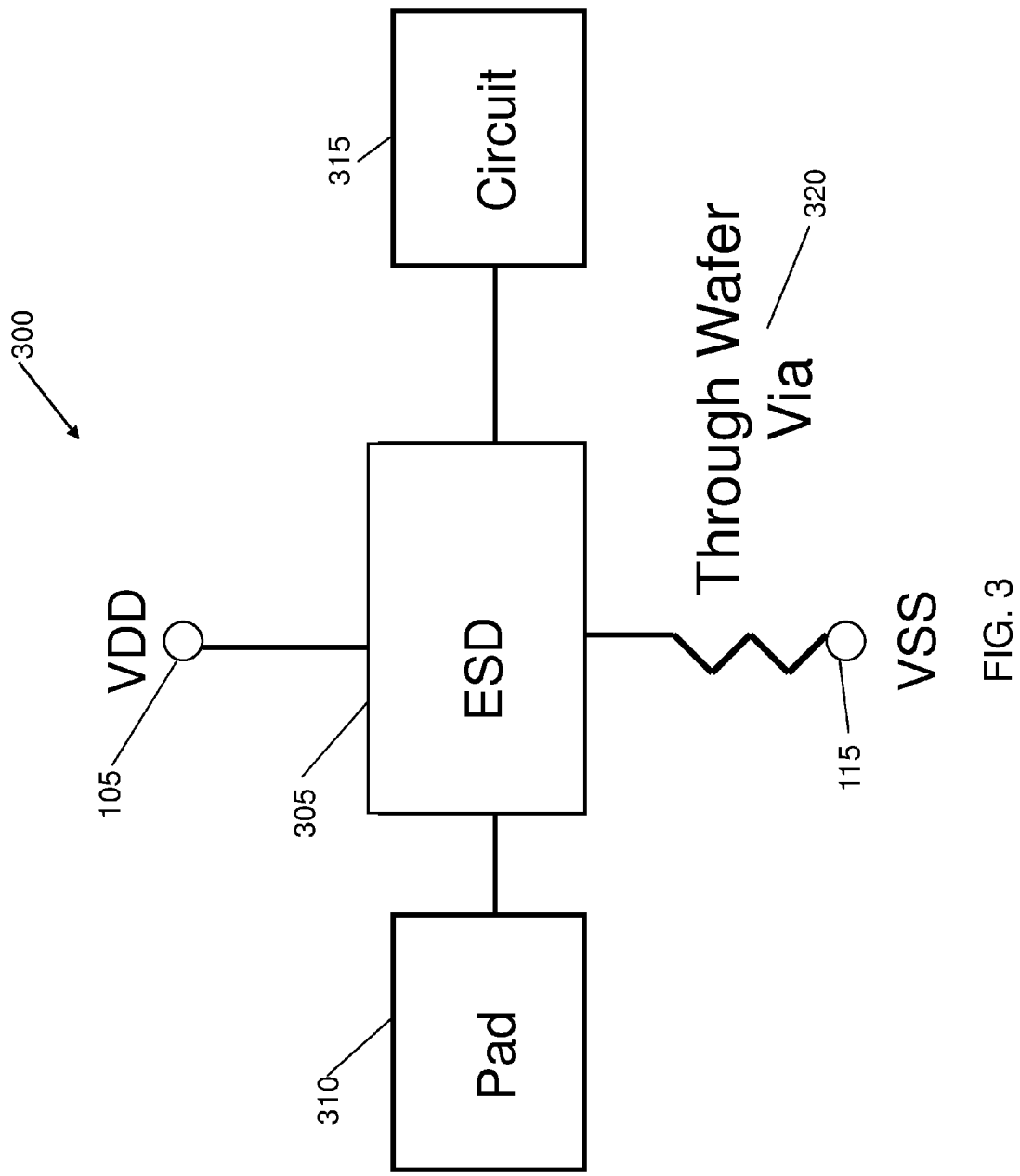
FIG. 3 shows an exemplary circuit schematic of an ESD network in accordance with aspects of the invention.

FIG. 3 shows an exemplary ESD network 300 in accordance with aspects of the invention. As shown in FIG. 3, an ESD circuit 305 (e.g., a dual diode ESD circuit) is electrically connected to the VDD positive power supply 105 and the VSS negative power supply 115. As should be understood by those having ordinary skill in the art, the dual diode ESD circuit is an exemplary ESD circuit, and the ESD circuit may be any active or passive element operable to perform an ESD function.

Additionally, as shown in FIG. 3, the ESD circuit 305 is between a pad 310 and the circuit 315, which is to be protected by the ESD circuit 305. Furthermore, in accordance with aspects of the invention, the ESD circuit 305 utilizes a through wafer via 320 to provide a low resistance path from the VSS negative power supply 115 to the substrate (or ground), as explained further below. That is, an electrical connection is provided to the substrate from the ESD circuit 305 by the through wafer via 320 to provide low impedance shunt to the substrate. In embodiments, the low resistance path may be on the order of 0.01 Ohms to 0.1 Ohms, with other resistances contemplated by the invention.

Figure 4:
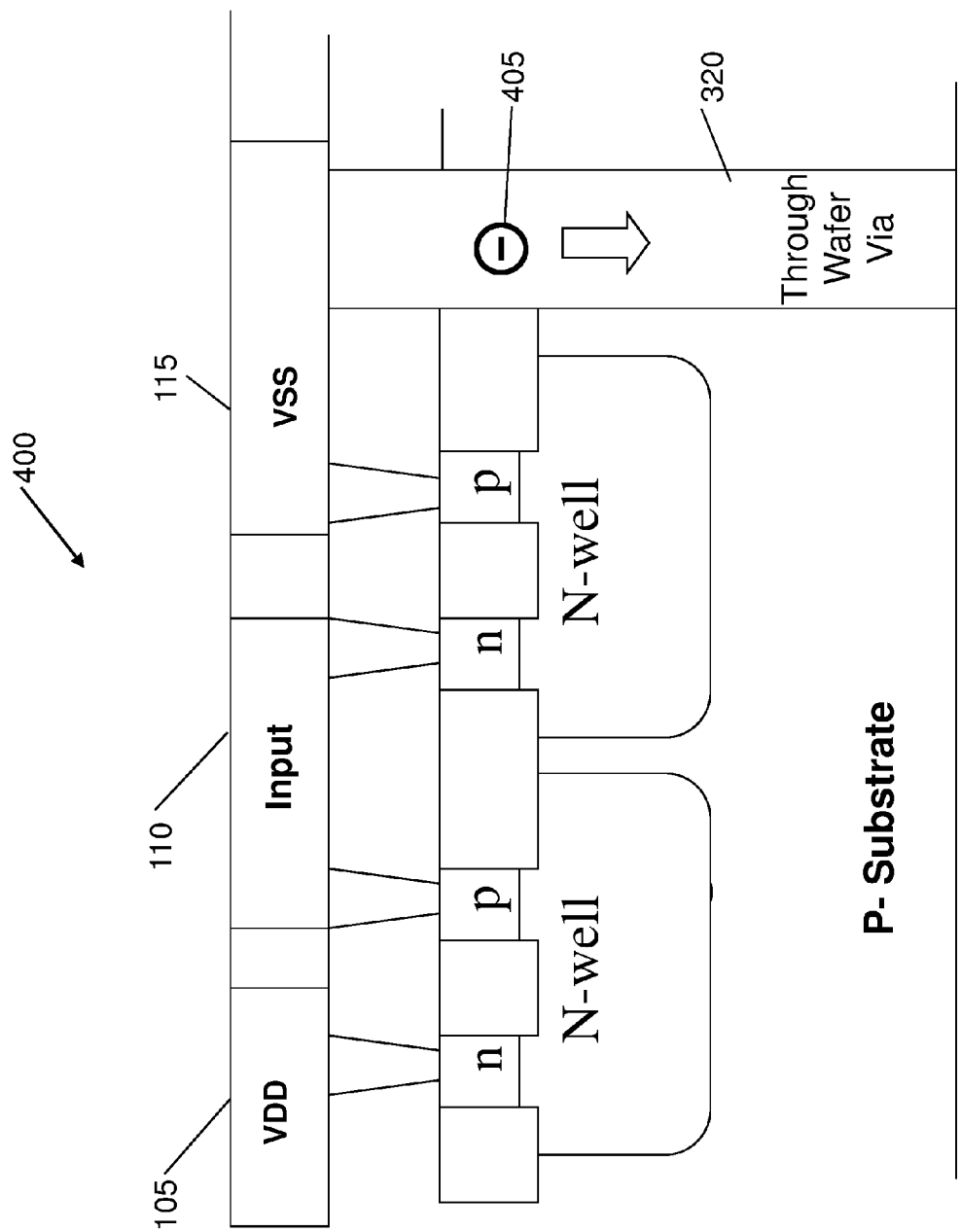
FIGS. 4-6 show exemplary side views of an ESD circuit with through wafer vias in accordance with aspects of the invention.

FIG. 4 shows an exemplary ESD network 400 in accordance with aspects of the invention. More specifically, FIG. 4 shows the ESD network 100 of FIG. 2 with a through wafer via 320 providing a low resistance contact to the substrate, e.g., a path from the VSS negative power supply 115 to the substrate. Thus, as shown in FIG. 4, the through wafer via 320 provides a path from the VSS negative power supply 115 to the substrate such that the electrons 405 are shunted to ground. That is, instead of going back up to the VDD positive power supply 105, the electrical connection between the VSS negative power supply 115 and the through wafer via 320 provide a path for electrons 405 straight into the ground plane (not shown) of the substrate. The through wafer via 320 can be formed using a conventional lithographic and etching process, known to those of skill in the art.

Figure 5:
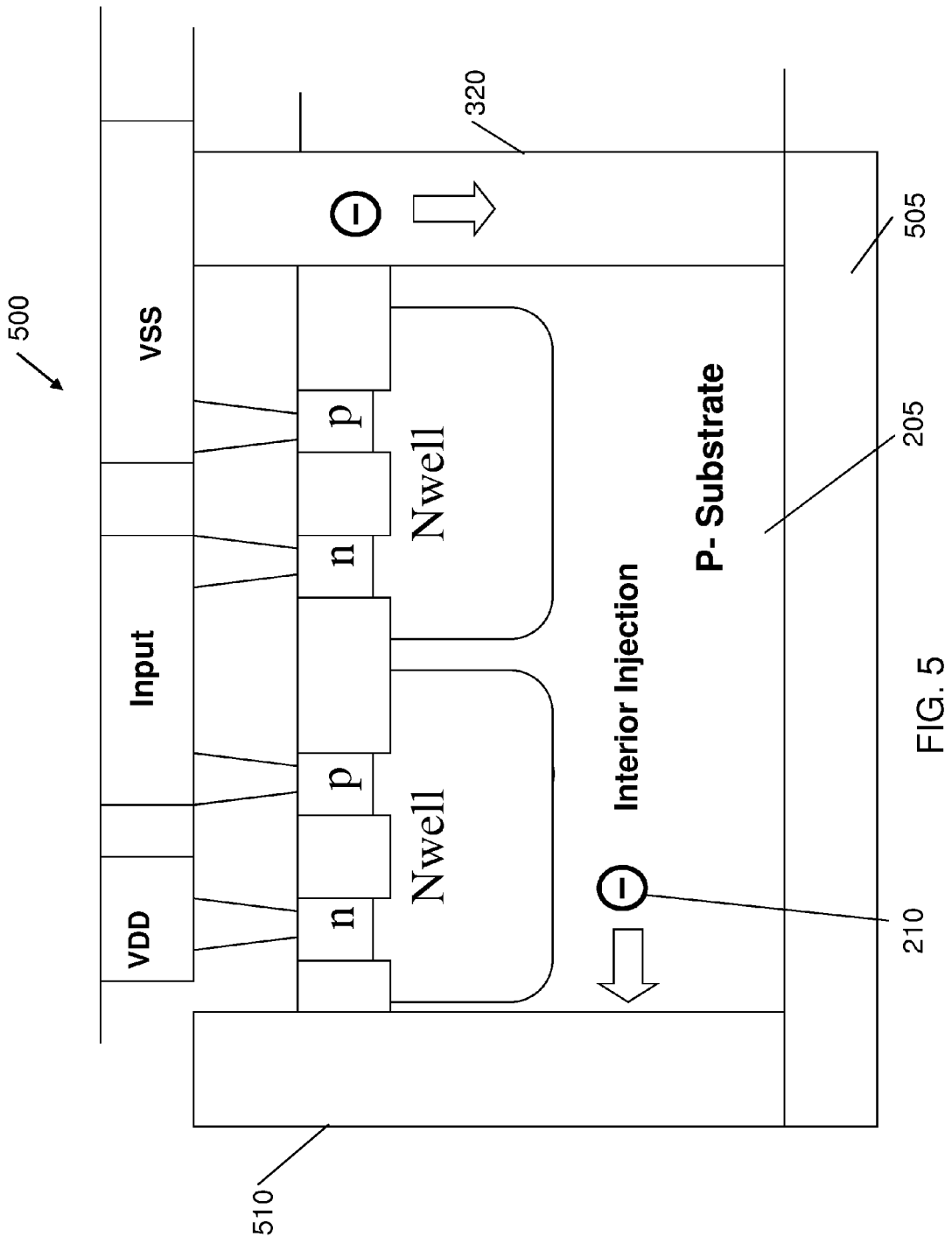

FIG. 5 shows an exemplary ESD network 500 in accordance with aspects of the invention. More specifically, FIG. 5 shows the ESD network 100 of FIG. 2 with a through wafer via 320 providing a low resistance shunt from the VSS negative power supply 115 to the substrate. Additionally, FIG. 5 shows a metal ground plane 505 in contact with both through wafer via 320 and an additional through wafer via 510. It should be understood that through wafer via 510 is not in contact with the VDD positive power supply 105. That is, through wafer via 510 is grounded through contact with the ground plane 505, but is otherwise not connected to other elements of the ESD network 500.

As shown in FIG. 5, in accordance with aspects of the invention, through wafer via 320 acts as the low resistance shunt to ground, and through wafer vias 320 and 510 (in conjunction with the ground plane 505 and additional through wafer vias not shown in this view) act as a "guard ring" for the ESD network 500 to prevent the negative carrier injection 210 of the ESD network 100 into adjacent circuitry (not shown) beyond the through wafer vias 320 and 510. In other words, the through wafer vias 320 and 510 act as a guard ring, to prevent electrons from going anywhere else or coming in. That is, instead of the electrons 210 traveling through the P-substrate 205 to adjacent circuitry (not shown), the electrons 210 are blocked by the through wafer vias 320 and 510 acting as a guard ring and channeled to ground.

Figure 6:
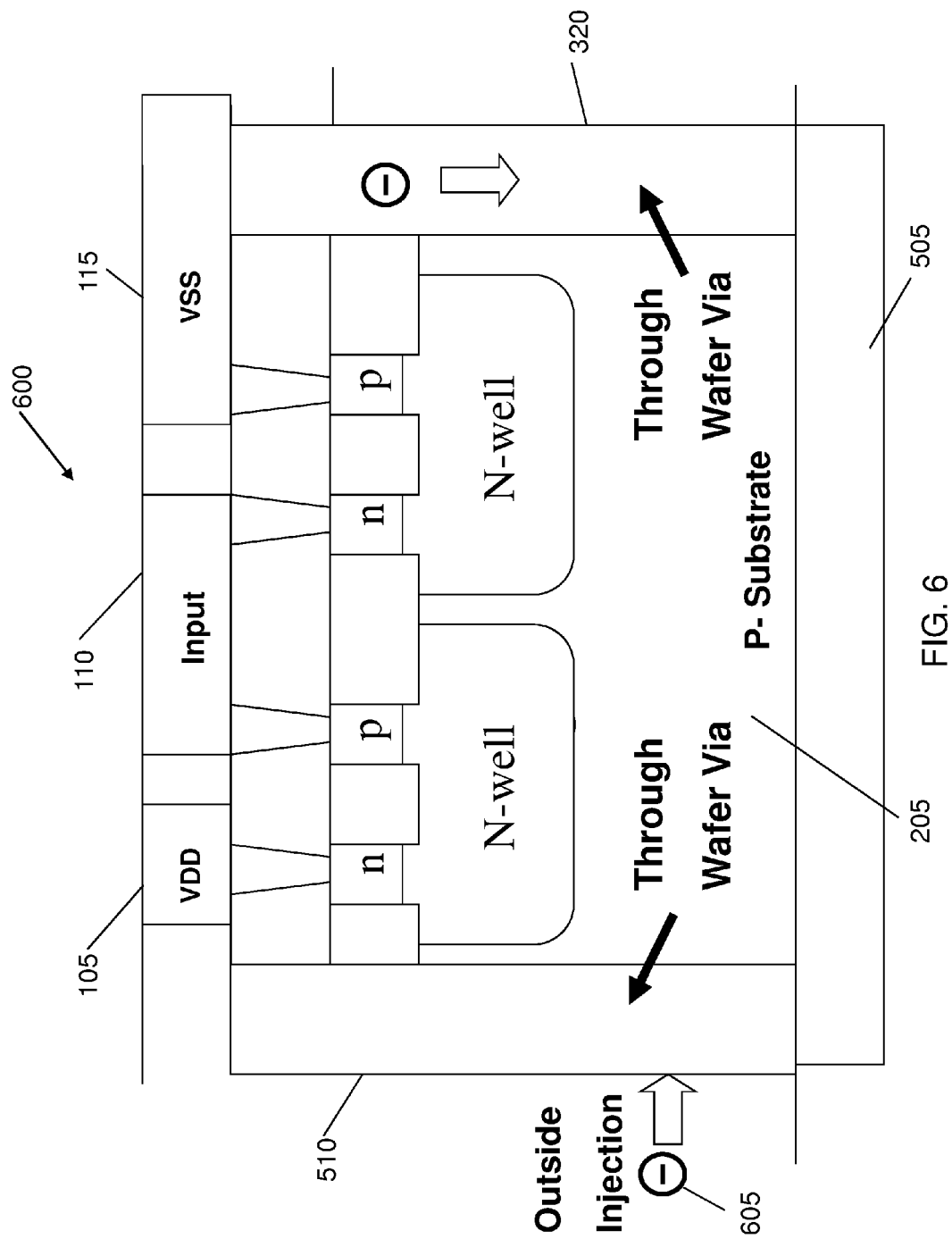

FIG. 6 shows the exemplary ESD network 500 of FIG. 5 illustrating the prevention of lateral minority carrier injection 605 from injection sources, e.g., observed in NMOS, PMOS or CMOS semiconductor chips, beyond the ESD network 500. As shown in FIG. 6, the outside injection of minority carriers 605 from circuitry beyond the ESD network is likewise prevented by the through wafer vias 320 and 510 acting as a guard ring. Thus, in accordance with aspects of the invention, with an outside minority carrier injection, the electrons 605 are directed to ground by the through wafer vias 320 and 510 acting as a guard ring. As such, the ESD network is protected from outside injection of minority carriers 605 from circuitry (not shown) beyond the ESD network 500.

The guard ring(s) provides a barrier or isolation structure to the ESD network 500 from external sources (not shown). These external sources can be, for example, from other devices, from alpha particles, cosmic rays, noise, cable discharge events, heavy ions, or any single event latchup, to name a few. As further examples, the guard ring can prevent injection from a second source such as, for example, sub circuits, other ESD devices, high voltage logic and the like. In operation, for example, when the guard ring is composed of a metal material, for example, the external source will contact the metal and sink to the substrate.

Figure 7:
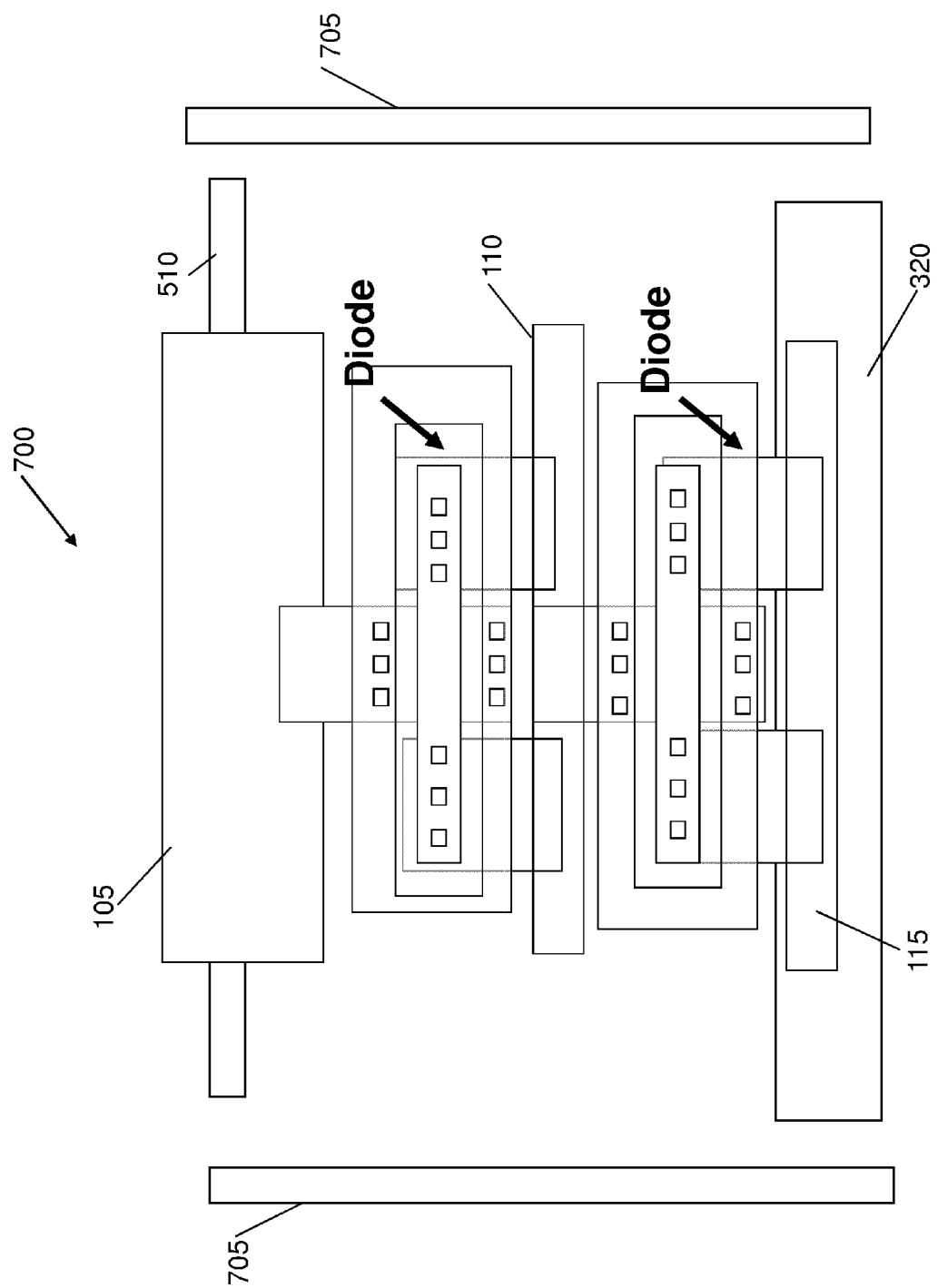
FIGS. 7 and 8 show exemplary top views of an ESD circuit with through wafer vias in accordance with aspects of the invention.

FIG. 7 shows a top view of an exemplary ESD circuit 700 in accordance with aspects of the invention. More specifically, FIG. 7 shows the ESD circuit of FIG. 1 with through wafer vias 320, 510 and 705. Through wafer via 320 is in contact with the VSS negative power supply 115 to provide a low resistance path to ground, as explained above. As illustrated in the embodiment of FIG. 7, in embodiments, the through wafer via 510 may be situated under the VDD positive power supply 105. However, the through wafer via 510 is not in contact with the VDD positive power supply 105 (as shown in FIGS. 5 and 6). Additionally, as shown in FIG. 7, the through wafer vias 705 are provided to form, together with the through wafer vias 320 and 510, a guard ring around the ESD circuit 700.

With the embodiment of FIG. 7, the ESD circuit 700 with through wafer vias 320, 510 and 705 is operable to prevent inter-circuit negative carrier injection. Thus, in accordance with aspects of the invention, the guard ring acts to prevent negative carrier injection from leaving the region of the ESD circuit 700 and influencing the surrounding circuitry (as shown in FIG. 5). Additionally, the guard ring acts to prevent injection minority carriers external to the ESD circuit 700 from influencing the ESD circuit 700 (as shown in FIG. 6). Thus, FIG. 7 shows an ESD circuit 700 with through wafer vias to prevent inter-circuit negative carrier injection in accordance with aspects of the invention.

As should be understood by those of ordinary skill in the art, while the term through wafer via is used, in embodiments, the through wafer vias may be formed only partially through the wafer, e.g., from the back of the wafer all the way up to the insulating surface of the device. For example, in embodiments, the through wafer vias may be through the physical wafer but not through, e.g., the back end of the line wiring, the insulators, and/or the electrics.

Moreover, as shown in FIG. 7, the guard ring formed by the through wafer vias 320, 510 and 705 may not form a completely solid ring structure. That is, in embodiments, there may be gaps between the through wafer vias. This is because, for example, if drilling (or etching) were used to form a solid through wafer via guard ring, upon drilling (or etching), the entire center portion may fall out. As such, in embodiments, the guard ring structure may not be a true ring structure.

Thus, as shown in FIG. 7, in embodiments, the through wafer vias 320, 510, and 705 may be spaced from one another (e.g., one to two microns apart from one another) and they will still serve a guard ring function purpose because the negative carriers will be prevented from crossing the guard ring. Moreover, even if all the negative carriers are not prevented from crossing the guard ring, in embodiments, the guard ring still serves to obstruct a majority of the negative carriers even though the efficiency of the guard ring may not be one hundred percent.

Figure 8:
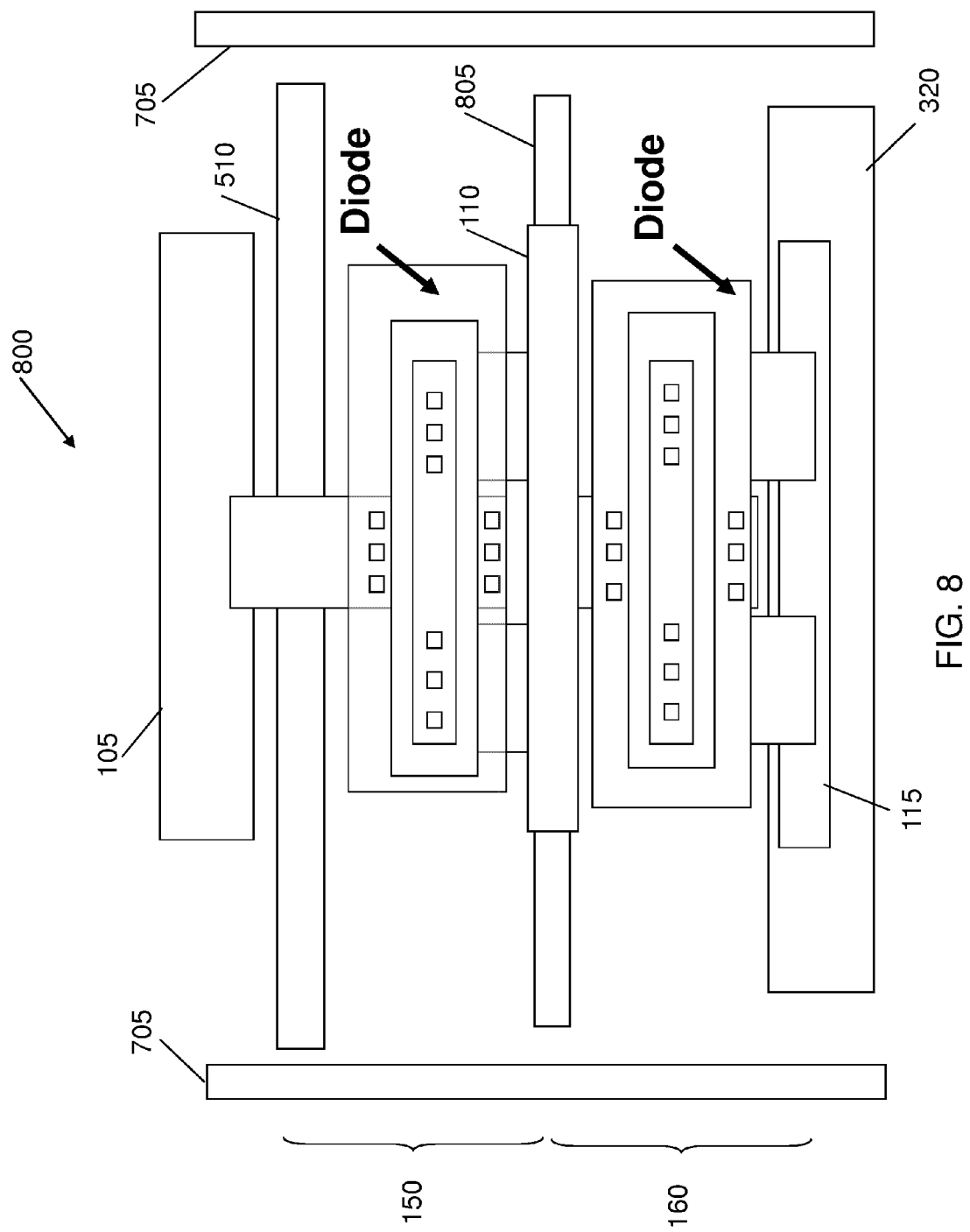

FIG. 8 shows a top view of an exemplary ESD circuit 800 in accordance with aspects of the invention. More specifically, FIG. 8 shows the ESD circuit of FIG. 1 with through wafer vias 320, 510 and 705 similar to those of FIG. 7. That is, the through wafer via 320 is in contact with the VSS negative power supply 115 to provide a low resistance path to ground, as explained above. Additionally, as shown in FIG. 8, through wafer vias 705 are provided to form, together with the through wafer vias 320 and 510, a guard ring around the ESD circuit 700. However, in contrast to FIG. 7, where through wafer via 510 may be situated under the VDD positive power supply 105, with the embodiment of FIG. 8, the through wafer via 510 is located between the VDD positive power supply 105 and the N-well 125. Additionally, the ESD circuit 800 includes an additional through wafer via 805 (e.g., an intra-circuit through wafer via) located under the input 110. Similar to the through wafer via 510, the through wafer via 805 is in contact with the ground plane (not shown), but is not in contact with the input 110.

With the embodiment of FIG. 8, the ESD circuit 800 with through wafer vias 320, 510, 705 and 805 is operable to prevent inter-circuit negative carrier injection and intra-circuit negative carrier injection. Thus, in accordance with aspects of the invention, the guard ring acts to prevent negative carrier injection from leaving the region of the ESD circuit 800 and influencing the surrounding circuitry (as shown in FIG. 5). Additionally, the guard ring acts to prevent injection minority carriers external to the ESD circuit 800 from influencing the ESD circuit 800 (as shown in FIG. 6).

Furthermore, the through wafer via 805 acts to prevent intra-circuit injection of minority carriers (i.e., within the dual diode ESD circuit). That is, as shown in FIG. 8, the through wafer via 805 prevents, for example, electrons from the lower diode 160 from being injected into the upper diode 150. While, with the example of FIG. 8, the ESD circuit 800 comprises a dual diode circuit, as should be understood by those ordinarily skilled in the art, the ESD circuit may comprise any number of elements that are operable to perform an ESD function. As shown in FIG. 8, a through wafer via 805 may be used to isolate any circuit element from different elements within the ESD circuit 800. In embodiments, depending on the type of circuit, e.g., type of ESD circuit, different circuit elements may be utilized, and it may be advantageous to provide isolation to some or all of these circuit elements using one or more intra-circuit through wafer vias. Thus, FIG. 8 shows an ESD circuit with through wafer vias to prevent inter-circuit negative carrier injection and intra-circuit negative carrier injection, in accordance with aspects of the invention.

ESD Structure with Through Wafer Vias and Inductor

In embodiments, for radio frequency (RF) applications for example, ESD circuits may require both active elements and inductors. However, ESD circuits with inductors present multiple challenges. Firstly, inductors themselves may be large, such that the inductors consume valuable circuit space. Secondly, in embodiments, inductors may require a shield to improve the quality factor (Q). The quality factor of an inductor is the ratio of its inductive reactance to its resistance at a given frequency, and is a measure of its efficiency. The higher the Q factor of the inductor, the closer the inductor approaches the behavior of an ideal, lossless, inductor.

Figure 9:
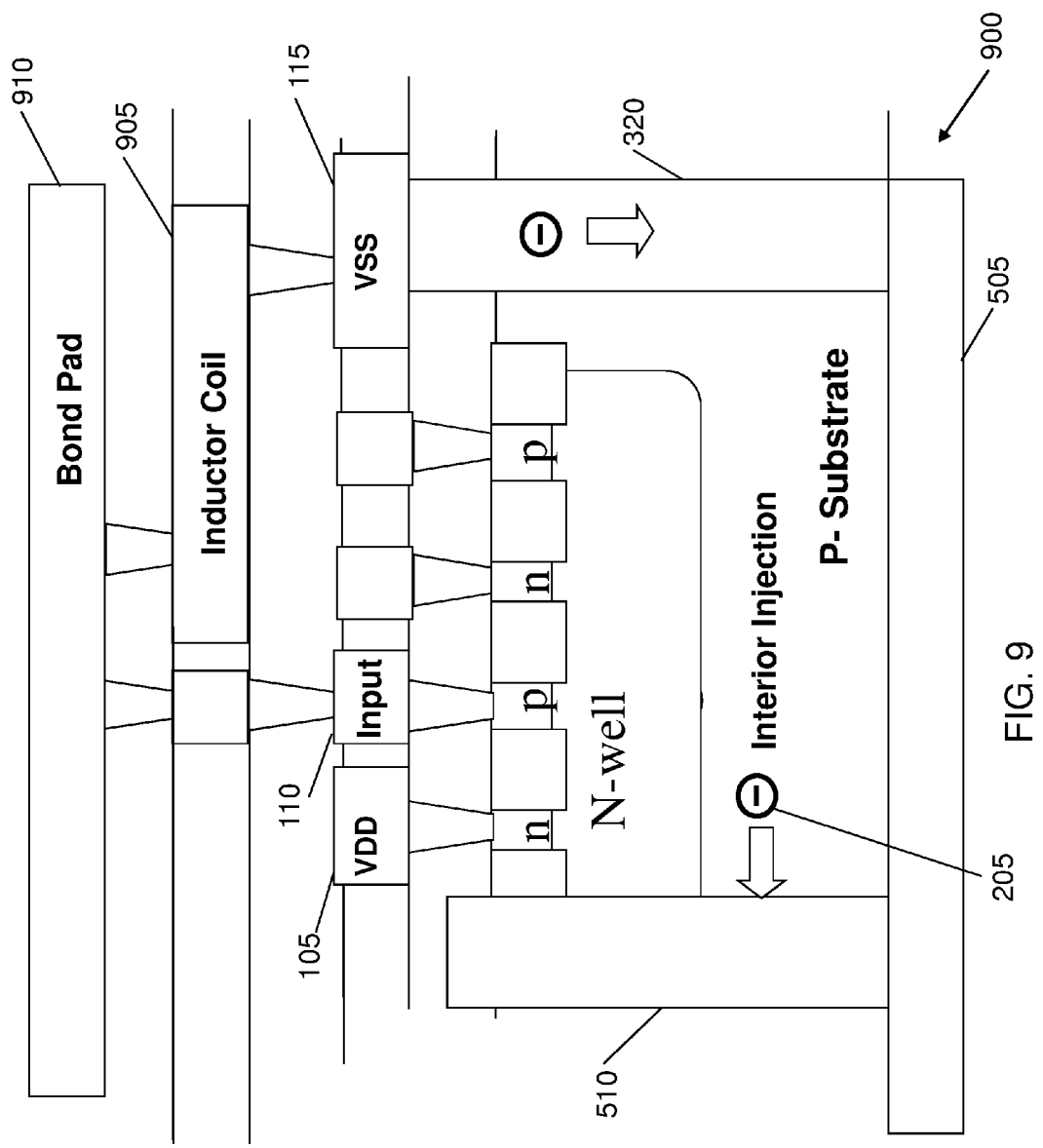
FIGS. 9 and 10 show exemplary side views of an ESD circuit with through wafer vias and an inductor in accordance with aspects of the invention.

FIG. 9 shows an ESD network 900 including an inductor 905 amongst other elements. More specifically, FIG. 9 shows an ESD network 900 including capacitor inductor circuits with a low impedance inductor coil 905 electrically connected to a through wafer via 320 through a connection with the VSS negative power supply 115. Additionally, in embodiments, the ESD network 900 includes a bond pad 910 electrically connected to the input 110 of the ESD network 900 and the inductor coil 905. By providing ESD network 900 with the through wafer via 320 and an ESD inductor 905 having a low resistance, wherein the inductor 905 is electrically connected back to the substrate 205, a lowest impedance path is created to the substrate 205.

More specifically, FIG. 9 shows an inductor coil 905 on top of a single diode 915. That is, instead of using two diodes (as shown, for example, in FIG. 4), with the embodiment of FIG. 9, by using an ESD device comprising a single diode, the silicon area may be reduced by half. Moreover, in embodiments, with the inductor coil 905 located on top of the silicon circuits, the physical area of the ESD network 900 is reduced. As shown in FIG. 9, a through wafer via 320 of the ESD network 900 serves as a shunt to the ground plane 505. Moreover, in accordance with aspects of the invention, the lower end of the inductor coil 905 is electrically connected to the through wafer via 320 through a connection with the VSS negative power supply 115.

Figure 10:
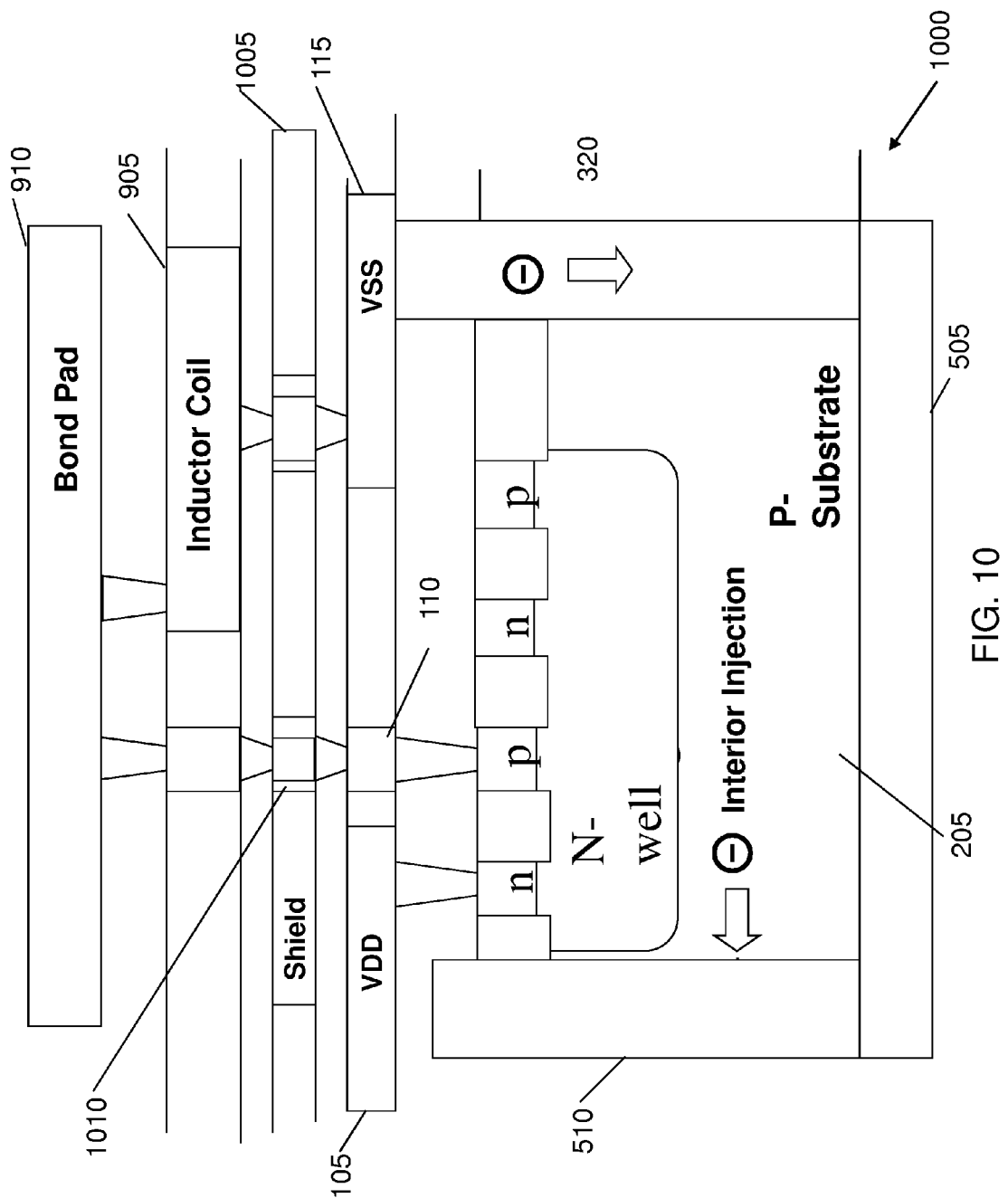

FIG. 10 shows an exemplary ESD network 1000 that includes an inductor 905 and an inductor shield 1005, in accordance with aspects of the invention. In embodiments, in order to isolate the inductor 905 from the substrate 205, a metal inductor shield 1005 may be arranged between the inductor 905 and the substrate 205. Moreover, as should be understood by those of ordinary skill in the art, the inductor shield 1005 may have slots therein so that no anti-currents can form in the inductor shield 1005. Thus, in accordance with aspects of the invention, in order to electrically connect the inductor coil 905 with the through wafer via 320, one or more passages 1010 may be created through the inductor shield 1005 (e.g., using an etching process, for example, an RIE process), and vias may be formed therein to connect the inductor coil 905 with the VSS negative power supply 115 (which is, in turn electrically connected to the through wafer via 320).

Additional Through Wafer Vias

Figure 11:
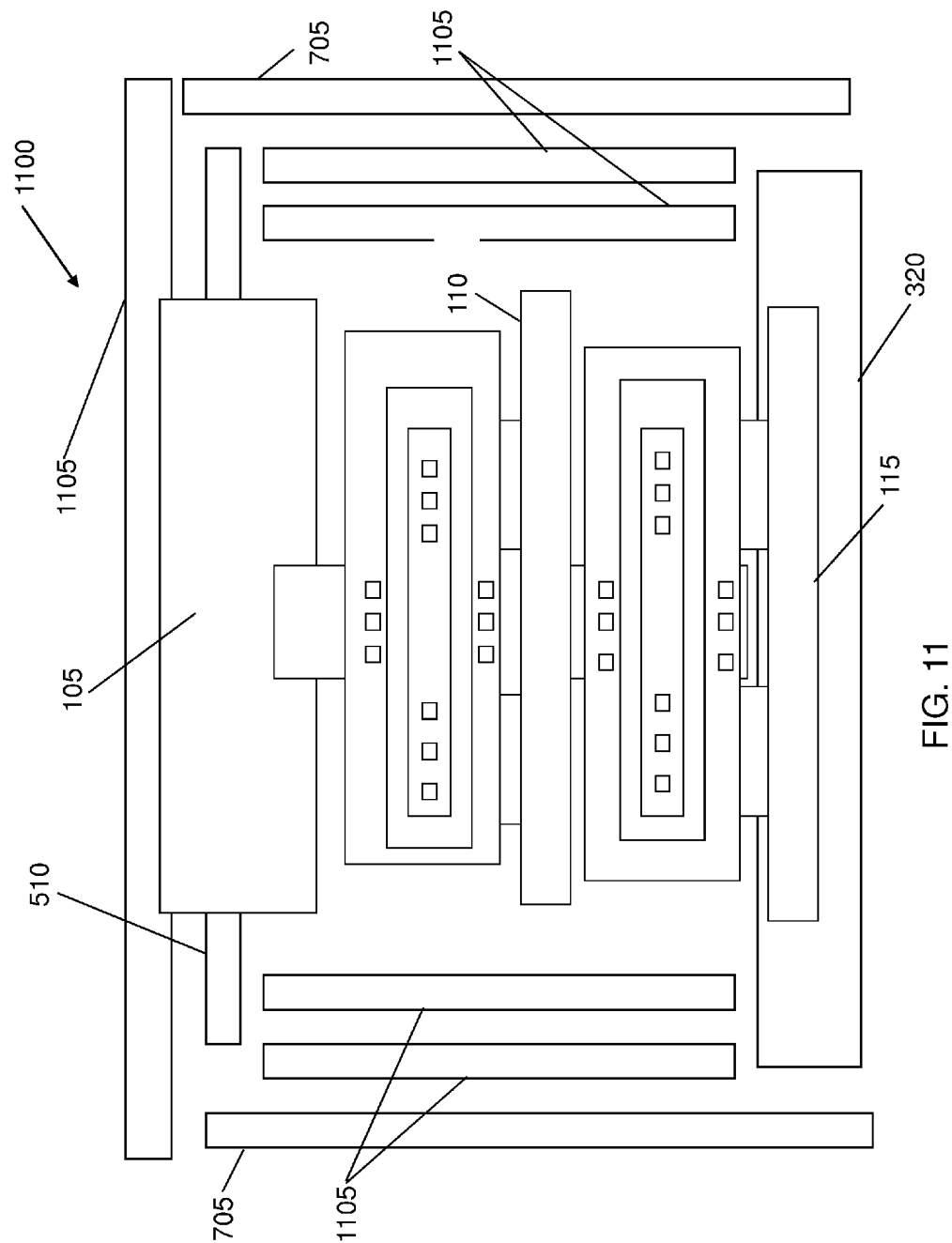
FIG. 11 shows an exemplary top view of an ESD circuit with additional through wafer vias in accordance with aspects of the invention.

FIG. 11 shows an exemplary ESD circuit 1100 with additional through wafer vias 1105 (for example, as compared to the embodiment of FIG. 7), in accordance with further aspects of the invention. More specifically, the embodiment of FIG. 11 includes the through wafer via 320 in electrical contact with the VSS negative power supply 115 and the ground plane (not shown). Furthermore, the embodiment of FIG. 11 includes through wafer vias 510 and 705, which are also in contact with the ground plane (as partially shown, for example, in FIG. 5).

Moreover, as shown in FIG. 11, additional through wafer vias 1105 may be formed in the substrate in contact with the ground plane (not shown) with gaps there between. Implementing the additional through wafer vias acts to reduce the resistance laterally and vertically in the ESD circuit 1100 even though the additional through wafer vias 1105 are not electrically connected to any other component other than the ground plane (similar to through wafer vias 510 and 705 described above). For example, utilizing additional through wafer vias will reduce the substrate resistance in the whole physical region of the circuit even though the VSS negative power supply 115 is only attached to the through wafer via 320. That is, even though the through wafer vias 510, 705 and 1105 are not directly connected to the VSS negative power supply 115, these through wafer vias 510, 705 and 1105 are connected to the VSS negative power supply 115 through the ground plane 505 (shown in FIG. 5) on the back side of chip substrate.

According to aspects of the invention, additional through wafer vias may serve to lower the whole resistance to the substrate underneath. In embodiments, the extent of the further lowering of the resistance of the substrate is dependent upon the spacing of the additional through wafer vias 1105 and through wafer vias 320, 510 and 705. For example, with closer spacings of the through wafer vias 320, 510, 705 and 1105, a lower substrate resistance may be obtained, and vice versa.

While FIG. 11 shows additional through wafer vias 1105 formed on the left and right hand sides of the ESD circuit 1100 within the through wafer vias 705 and an additional through wafer via 1105 formed beyond through wafer via 510, the invention contemplates that these additional through wafer vias 1105 may be formed beyond the through wafer vias 705 and within the through wafer via 510. Moreover, while FIG. 11 shows no additional through wafer via within or beyond through wafer via 320 (which also serves as the shunt to ground), the invention contemplates that an additional through wafer via may be formed within or beyond through wafer via 320. While FIG. 11 shows five additional through wafer vias, it should be understood that the invention contemplates any number of additional through wafer vias may be used to lower the whole resistance to the substrate.

The additional through wafer vias may or may not affect the guard ring barrier efficiency (or capability). For example, placing additional through wafer vias in different dimensions may improve the prevention of electrons from getting in or out of the ESD device, depending where the adjacent circuitry is located. Furthermore, as explained above, the additional through wafer vias will improve (i.e., lower) the resistance of the ESD structure.

Device Formation

In embodiments, the through wafer vias 320, 510, 705 and 1105 may be formed from the backside of the substrate using conventional etching processes, e.g., reactive ion etching (RIE). More specifically, after standard device formation, a mask can be placed on the top of the structure, the structure then flipped over and one or more through wafer vias are etched through the substrate using conventional lithography and etching processes. As should be understood, for the through wafer via 320 that is acting as both a guard ring and a low resistance path to ground, the via is etched such that the through wafer via 320 is in electrical contact with the VSS negative power supply 115. After the etching process, the vias can be filled with different materials, depending on the particular application. These materials can be a refractory metal, aluminum, an insulator, or a metal material with an insulator liner. The structure is then polished using conventional polishing techniques such as, for example, chemical mechanical polishing. Additionally, a ground plane may be deposited on the bottom of the substrate in electrical contact with each of the through wafer vias 320, 510, 705 and, in embodiments, 1105.

Design Structure

Figure 12:
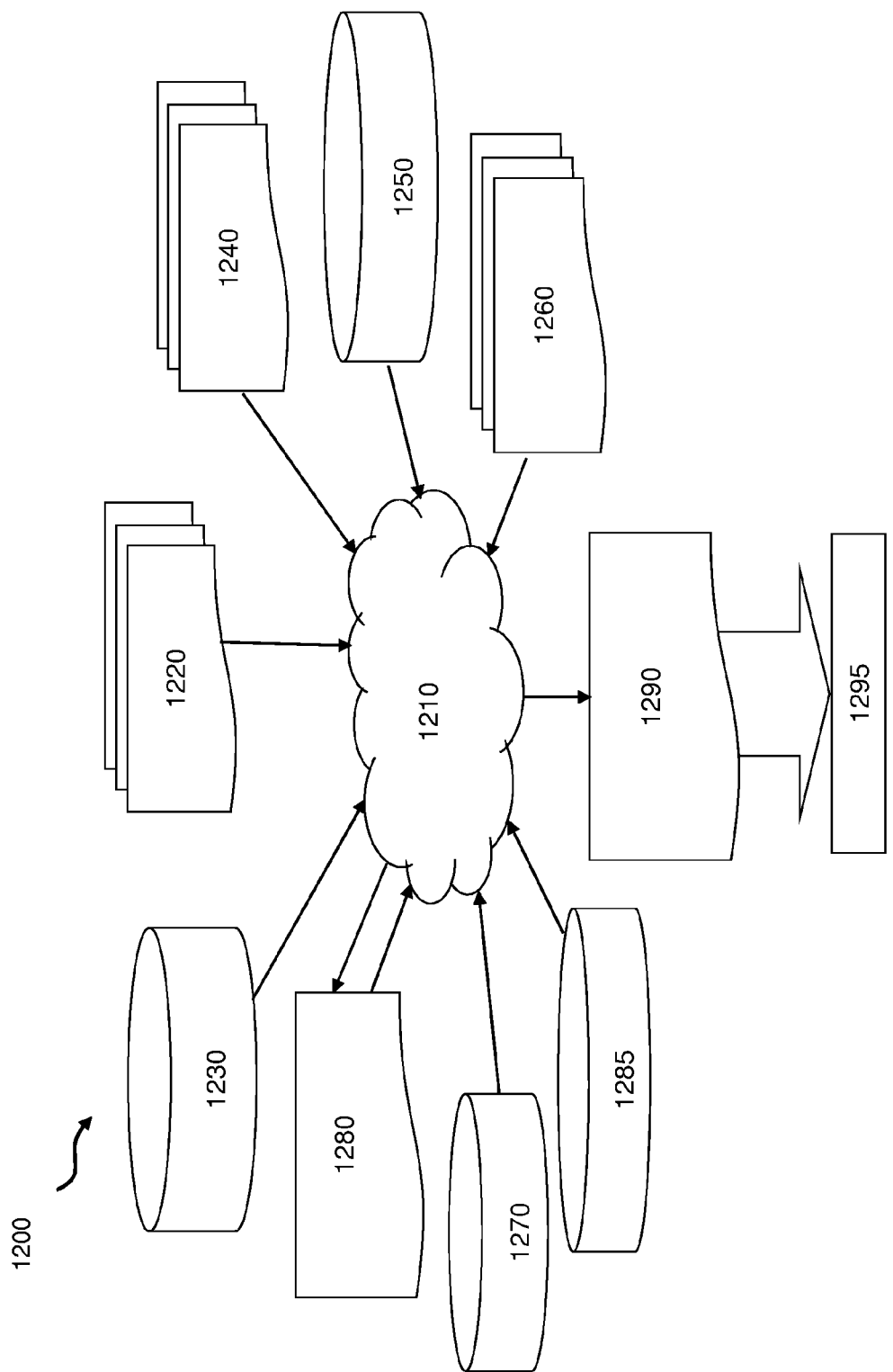
FIG. 12 is a flow diagram of a design process used in semiconductor design, manufacturing, and/or testing.

FIG. 12 shows a block diagram of an exemplary design flow 1200 used for example, in semiconductor IC logic design, simulation, test, layout, and manufacture. Design flow 1200 includes processes and mechanisms for processing design structures to generate logically or otherwise functionally equivalent representations of the embodiments of the invention shown in FIGS. 4-11. The design structures processed and/or generated by design flow 1200 may be encoded on machine-readable transmission or storage media to include data and/or instructions that when executed or otherwise processed on a data processing system generate a logically, structurally, or otherwise functionally equivalent representation of hardware components, circuits, devices, or systems.

FIG. 12 illustrates multiple such design structures including an input design structure 1220 that is preferably processed by a design process 1210. Design structure 1220 may be a logical simulation design structure generated and processed by design process 1210 to produce a logically equivalent functional representation of a hardware device. Design structure 1220 may also or alternatively comprise data and/or program instructions that when processed by design process 1210, generate a functional representation of the physical structure of a hardware device. Whether representing functional and/or structural design features, design structure 1220 may be generated using electronic computer-aided design (ECAD) such as implemented by a core developer/designer. When encoded on a machine-readable data transmission or storage medium, design structure 1220 may be accessed and processed by one or more hardware and/or software modules within design process 1210 to simulate or otherwise functionally represent an electronic component, circuit, electronic or logic module, apparatus, device, or system such as those shown in FIGS. 4-11. As such, design structure 1220 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1210 preferably employs and incorporates hardware and/or software modules for synthesizing, translating, or otherwise processing a design/simulation functional equivalent of the components, circuits, devices, or logic structures shown in FIGS. 4-11 to generate a netlist 1280 which may contain design structures such as design structure 1220. Netlist 1280 may comprise, for example, compiled or otherwise processed data structures representing a list of wires, discrete components, logic gates, control circuits, I/O devices, models, etc. that describes the connections to other elements and circuits in an integrated circuit design. Netlist 1280 may be synthesized using an iterative process in which netlist 1280 is resynthesized one or more times depending on design specifications and parameters for the device. As with other design structure types described herein, netlist 1280 may be recorded on a machine-readable data storage medium. The medium may be a non-volatile storage medium such as a magnetic or optical disk drive, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1210 may include hardware and software modules for processing a variety of input data structure types including netlist 1280. Such data structure types may reside, for example, within library elements 1230 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1240, characterization data 1250, verification data 1260, design rules 1270, and test data files 1285 which may include input test patterns, output test results, and other testing information. Design process 1210 may further include modules for performing standard circuit design processes such as timing analysis, verification, design rule checking, place and route operations, etc.

Design process 1210 employs and incorporates well-known logic and physical design tools such as HDL compilers and simulation model build tools to process design structure 1220 together with some or all of the depicted supporting data structures to generate a second design structure 1290. Similar to design structure 1220, design structure 1290 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 4-11. In one embodiment, design structure 1290 may comprise a compiled, executable HDL simulation model that functionally simulates the devices shown in FIGS. 4-11.

Design structure 1290 may also employ a data format used for the exchange of layout data of integrated circuits and/or symbolic data format (e.g. information stored in a GDSII (GDS2), GL1, OASIS, map files, or any other suitable format for storing such design data structures). Design structure 1290 may comprise information such as, for example, symbolic data, map files, test data files, design content files, manufacturing data, layout parameters, wires, levels of metal, vias, shapes, data for routing through the manufacturing line, and any other data processed by semiconductor manufacturing tools to fabricate embodiments of the invention as shown in FIGS. 4-11. Design structure 1290 may then proceed to a stage 1295 where, for example, design structure 1290: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method comprising:
    forming an ESD active device on a substrate and electrically connected between an input and at least one power rail;
    forming a ground plane on a backside of the substrate, wherein the ground plane is formed on a bottom of the substrate;
    forming at least one through wafer via structure to provide a low series resistance path to the substrate, wherein the at least one through wafer via structure is in contact with a negative power supply; and
    forming at least one additional through wafer via structure, wherein both of the at least one through wafer via structure and the at least one additional through wafer via structure are in contact with the ground plane and provide a guard ring to prevent minority carrier migration.

2. The method of claim 1, further comprising forming at least one further through wafer via structure in contact with the ground plane and structured and arranged to lower a resistance of the ESD active device at least one of laterally and vertically.

3. A method comprising:
    forming an ESD active device on a substrate and electrically connected between an input and at least one power rail;
    forming at least one through wafer via structure to provide a low series resistance path to the substrate; and
    forming a ground plane on a bottom of the substrate and electrically connected to the at least one through wafer structure,
    wherein the at least one through wafer via structure is in contact with a negative power supply and the ground plane formed on the bottom of the substrate.

4. A method comprising:
    forming an ESD active device on a substrate and electrically connected between an input and at least one power rail;
    forming at least one through wafer via structure to provide a low series resistance path to the substrate;
    forming at least one inductor electrically connected to the at least one through wafer via structure through a connection with a VSS negative power supply;
    providing an inductor shield between the at least one inductor and the at least one through wafer via structure;
    etching one or more passages through the inductor shield; and
    forming one or more vias within the one or more passages through the inductor shield to form the connection between the at least one inductor and the VSS negative power supply.

* * * * *